United States Patent
Emek

(10) Patent No.: US 7,395,196 B2
(45) Date of Patent: Jul. 1, 2008

(54) TEST-CASES FOR FUNCTIONAL VERIFICATION OF SYSTEM-LEVEL INTERCONNECT

(75) Inventor: Roy Emek, Tel Aviv (IL)

(73) Assignee: International Business Machines Corporation, Armonk, NY (US)

( * ) Notice: Subject to any disclaimer, the term of this patent is extended or adjusted under 35 U.S.C. 154(b) by 560 days.

(21) Appl. No.: 10/929,935

(22) Filed: Aug. 30, 2004

(65) Prior Publication Data

US 2006/0048082 A1    Mar. 2, 2006

(51) Int. Cl.
G06F 17/50    (2006.01)
(52) U.S. Cl. .............................. 703/14; 703/17
(58) Field of Classification Search .............. 703/14, 703/16; 716/5; 702/117; 714/33, 728, 738
See application file for complete search history.

(56) References Cited

OTHER PUBLICATIONS

Erik Jan Marinissen et al., "Challenges in Testing Core-Based System ICs" IEEE, 1999, pp. 104-109.*

Asad A Ismaeel et al., "The Probability of Error Detection in Sequential Circuits Using Random Test Vectors" Journal of Electronic testing, pp. 245-256, 1991.*

Lukai Cai et al., "Transaction Level Modeling: An Overview" CODES+ISSS, ACM, 1993 pp. 19-24.*

Mike G. Bartley et al., "A Comparison of Three Verification Techniques: Directed Testing, Pseudo-Random Testing and PRoperty Checking" DAC, ACM, 2002, pp. 819-823.*

A. Aharon, "Verification of the IBM RISC System/6000 by a dynamic biased pseudo-random test program generator", IBM systems Journal, vol. 30, No. 4, 1991, pp. 527-538.*

* cited by examiner

Primary Examiner—Paul Rodriguez
Assistant Examiner—Luke Osborne

(57) ABSTRACT

Generation of test cases for functional verification of a complex system-under-test is achieved by the use of a probability matrix. The probability matrix represents a non-uniform distribution function of resource combinations used in the transactions, and can be created randomly, or by application of various types of testing knowledge. The matrix is used by a test generator for selecting resources that participate in a transaction involving an interconnect between different types of system components. Applying the inventive principles increases the quality of design verification by stimulation of both the system's resources and its internal interconnects, with almost no knowledge of the structure of the system.

32 Claims, 2 Drawing Sheets

TEST-CASES FOR FUNCTIONAL VERIFICATION OF SYSTEM-LEVEL INTERCONNECT

BACKGROUND OF THE INVENTION

1. Field of the Invention

This invention relates to functional verification of a hardware system. More particularly, this invention relates to functional verification of the system-level interconnects of hardware systems or designs having different types of interconnected resources.

2. Description of the Related Art

Functional verification is widely acknowledged to be a bottleneck in the hardware system's design cycle. Indeed, up to 70% of development time and resources are typically spent on functional verification. Allowing users to find design flaws, and fixing them in a subsequent release would be unwise and costly for three main reasons: (1) harm to reputation and brand-name; (2) a high cost of recall and replacement when there is a large installed base; and (3) litigation, should design flaws cause injury.

During the last few years, complex hardware systems have shifted from custom ASIC's towards system-on-a-chip (SoC) based designs, which include ready made components. The verification of such systems requires new tools and methodologies that are up to the new challenges raised by the characteristics of systems and SoC's.

At the heart of these challenges stands the requirement to verify the integration of several previously designed components in a relatively short time.

In current industrial practice, dynamic verification is the main functional verification technique for large and complex systems. Dynamic verification is accomplished by generating a large number of tests using random test generators, simulating the tests on the system-under-test, and checking that the system-under-test behaves according to its specification.

The rationale behind verification by simulation is that one acquires confidence in the correctness of a system-under-test by running a set of test cases that encompass a sufficiently large number of different cases, which in some sense is assumed to be a representative sample of the full space of possible cases. The ability of the system-under-test to correctly handle all cases is inferred from the correct handling of the cases actually tested. This approach is discussed, for example, in the document *User Defined Coverage—A Tool Supported Methodology for Design Verification*, Raanan Grinwald, Eran Harel, Michael Orgad, Shmuel Ur, and Avi Ziv, Proc. 38th Design Automation Conference (DAC38), pages 158-163, 1998. When conducting simulations, it is desirable to define a particular subspace, which is considered to be "interesting" in terms of verification, and then to generate tests selected at random that cover the subspace.

Test cases developed by algorithms such as the foregoing are typically implemented on a test generator, which may optionally bias the tests based on internal testing knowledge. Such test generators are described in the following documents: *Model-Based Test Generation For Processor Design Verification*, Y. Lichtenstein, Y. Malka and A. Aharon, Innovative Applications of Artificial Intelligence (IAAI), AAAI Press, 1994; *Constraint Satisfaction for Test Program Generation*, L. Fournier, D. Lewin, M. Levinger, E. Roytman and Gil Shurek, Int. Phoenix Conference on Computers and Communications, March 1995; and *Test Program Generation for Functional Verification of PowerPC Processors in IBM*, A. Aharon, D. Goodman, M. Levinger, Y. Lichtenstein, Y. Malka, C. Metzger, M. Molcho and G. Shurek, 32nd Design Automation Conference, San Francisco, June 1995, pp. 279-285.

The term coverage concerns checking and showing that testing has been thorough. Coverage is the prime measurement for the quality of a set of test cases. Simply stated, the idea in coverage is to create, in a systematic fashion, a large and comprehensive list of tasks, and to check that each task is executed in the testing phase. Ultimately, higher coverage implies greater chances of exposing a design flaw.

SUMMARY OF THE INVENTION

In embodiments of the present invention, generation of test cases for functional verification of a complex system is achieved by the use of a n-dimensional probability matrix. The n-dimensional probability matrix represents a nonuniform distribution function of resource combinations used in transactions between components of the system being verified, and can be created randomly, or by application of various types of testing knowledge. The matrix is used by a test generator for selecting resources that participate in a transaction involving the system's interconnect. Typically, for a given transaction, a n-dimensional probability matrix is customized for selection of the combination of resources to be used in the transaction. During the generation of a set of test cases, the same probability matrix can be recycled for all like transactions. As a result, some combinations of resources are used more often then others, thereby stressing the interconnect between the resources participating in the favored combinations.

Applying the inventive principles increases the quality of design verification by more appropriate stimulation of both the system's resources and its internal interconnects, with almost no knowledge of the structure of the system.

The invention provides a method of verifying a system design having a plurality of first resources, a plurality of second resources, and an interconnect therebetween, which is carried out by defining a transaction, wherein a selected one of the first resources communicates with a selected one of the second resources via the interconnect, defining a distribution function of probabilities of establishing the transaction between each of the first resources and each of the second resources, and generating a test program that includes an instance of the transaction, wherein the first resource and the second resource are selected responsively to the distribution function. The test program is then executed on the system design, for example by simulation.

According to one aspect of the method, the distribution function is represented as a probability matrix, each cell of the matrix representing a probability of a combination of one of the first resources and one of the second resources in the transaction.

According to another aspect of the method, the matrix is defined randomly.

According to a further aspect of the method, the matrix is defined under control of specified parameters.

The invention provides a computer software product, including a computer-readable medium in which computer program instructions are stored, which instructions, when read by a computer, cause the computer to perform a method of verifying a system design having a plurality of first resources, a plurality of second resources, and an interconnect therebetween, which is carried out by defining a transaction, wherein a selected one of the first resources communicates with a selected one of the second resources via the interconnect, defining a distribution function of probabilities of establishing the transaction between each of the first resources and each of the second resources, and generating a test program that includes an instance of the transaction, wherein the first resource and the second resource are selected responsively to the distribution function. The test program is then executed on the system design, for example by simulation.

The invention provides a verification system for testing a system design of a type has a plurality of first resources, a plurality of second resources, and an interconnect therebetween, including a processor operative to perform a method of verifying a system design having a plurality of first resources, a plurality of second resources, and an interconnect therebetween, which is carried out by defining a transaction, wherein a selected one of the first resources communicates with a selected one of the second resources via the interconnect, defining a distribution function of probabilities of establishing the transaction between each of the first resources and each of the second resources, and generating a test program that includes an instance of the transaction, wherein the first resource and the second resource are selected responsively to the distribution function. The test program is then executed on the system design, for example by simulation.

The invention provides a method of verifying a system design having a plurality of resources including n resource categories, including a first resource and a second resource, and an interconnect therebetween, which is carried out by defining a transaction, wherein the first resource communicates with the second resource via the interconnect, defining a n-dimensional distribution function of probabilities of establishing the transaction between any two of the resources, wherein each dimension of the distribution function corresponds to one of the resource categories, and generating a test program that includes an instance of the transaction, wherein the first resource and the second resource are selected responsively to the distribution function. The test program is then executable on the system design, for example by simulation.

According to one aspect of the method, the distribution function is represented as a n-dimensional probability matrix, each cell of the matrix representing a probability of a combination of one of the resources and another of the resources in the transaction.

According to an additional aspect of the method, the matrix is defined randomly.

According to still another aspect of the method, the matrix is defined under control of specified parameters.

The invention provides a computer software product, including a computer-readable medium in which computer program instructions are stored, which instructions, when read by a computer, cause the computer to perform a method of verifying a system design having a plurality of resources including n resource categories, including a first resource and a second resource, and an interconnect therebetween, which is carried out by defining a transaction, wherein the first resource communicates with the second resource via the interconnect, defining a n-dimensional distribution function of probabilities of establishing the transaction between any two of the resources, wherein each dimension of the distribution function corresponds to one of the resource categories, and generating a test program that includes an instance of the transaction, wherein the first resource and the second resource are selected responsively to the distribution function. The test program is then executable on the system design, for example by simulation.

The invention provides a verification system of verifying a system design of a type has a plurality of resources including n resource categories, including a first resource and a second resource, and an interconnect therebetween, including a processor operative to perform a method of verifying a system design having a plurality of resources including n resource categories, including a first resource and a second resource, and an interconnect therebetween, which is carried out by defining a transaction, wherein the first resource communicates with the second resource via the interconnect, defining a n-dimensional distribution function of probabilities of establishing the transaction between any two of the resources, wherein each dimension of the distribution function corresponds to one of the resource categories, and generating a test program that includes an instance of the transaction, wherein the first resource and the second resource are selected responsively to the distribution function.

According to an aspect of the verification system, the processor is operative to execute the test program on the system design.

BRIEF DESCRIPTION OF THE DRAWINGS

For a better understanding of the present invention, reference is made to the detailed description of the invention, by way of example, which is to be read in conjunction with the following drawings, wherein like elements are given like reference numerals, and wherein.

DETAILED DESCRIPTION OF THE INVENTION

Figure 1:
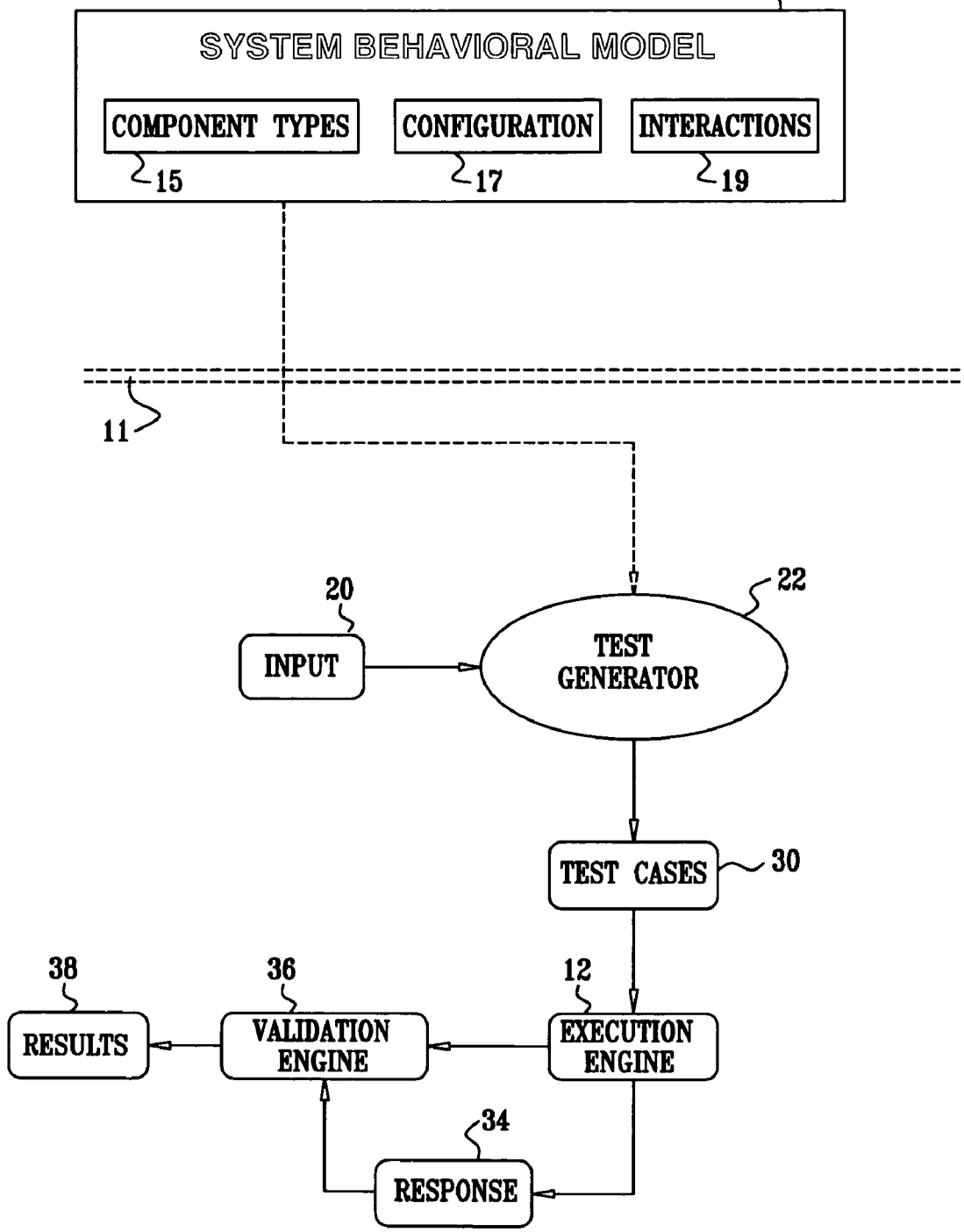
FIG. 1 is a block diagram of a verification system that is operable in accordance with a disclosed embodiment of the invention.

In the following description, numerous specific details are set forth in order to provide a thorough understanding of the present invention. It will be apparent to one skilled in the art, however, that the present invention may be practiced without these specific details. In other instances, well-known circuits, control logic, and the details of computer program instructions for conventional algorithms and processes have not been shown in detail in order not to obscure the present invention unnecessarily.

Software programming code, which embodies aspects of the present invention, is typically maintained in permanent storage, such as a computer readable medium. In a client-server environment, such software programming code may be stored on a client or a server. The software programming code may be embodied on any of a variety of known media for use with a data processing system. This includes, but is not limited to, magnetic and optical storage devices such as disk drives, magnetic tape, compact discs (CD's), digital video discs (DVDIs), and computer instruction signals embodied in a transmission medium with or without a carrier wave upon which the signals are modulated. For example, the transmission medium may include a communications network, such as the Internet. In addition, while the invention may be embodied in computer software, the functions necessary to implement the invention may alternatively be embodied in part or in whole using hardware components such as application-specific integrated circuits or other hardware, or some combination of hardware components and software.

Overview

The term "testing knowledge" refers to methods aimed at increasing test case quality, which are useful for a variety of hardware systems. In general, testing knowledge targets areas that are bug prone, and consequently increases the coverage for many typical coverage models. The instant invention employs testing knowledge mechanisms at the system level.

A "system" as used herein, is a set of components connected using some form of interconnect, which is capable of performing a set of transactions. Components may include processors and other processing elements, caches, various types of memories, bridges, interrupt controllers, DMA engines, etc. The interconnect between these components may comprise, for example, several buses and the bus-bridges connecting them. In many cases, a system contains multiple instances of a certain type of component: for example, a system with symmetric multiprocessing would contain several processors. Examples of transactions include memory mapped I/O (MMIO) and direct memory access (DMA).

System verification deals, in essence, with the validation of the integration of several previously verified components. Inherently, it deals with large systems: verification methodologies that are appropriate at the unit or component level are not necessarily suitable for the system level. A related factor that is also crucial to verification is the intricacy of the specification of the system. As the aim of the verification effort is to show that a system implements its specification, complex specifications require special attention and affect the verification process. Other than the size of the system and the complexity of the specification, the main challenge related to system verification is the practical limitation of resources, and particularly short time schedules. Verification of an entire system can often start only after all its components have been brought to a certain level of stability, which, in many cases, leaves only a small time window for the system verification effort itself.

Turning now to the drawings, reference is initially made to FIG. 1, which is a block diagram of a verification system that is operable in accordance with a disclosed embodiment of the invention. A generic verification system 10, used for verifying a hardware system, has several basic interacting components, which can be realized using a general purpose computer, or a computer more particularly adapted for system verification. Those components of the verification system 10 that are located above a broken line 11 are dependent on the specification of the implementation being verified, while those located below the line 11 are independent of the specification. The principles of the invention can be applied to many different verification systems and test generator engines, particularly those adapted for testing systems and SoC's.

The verification system 10 enables the creation of tests that have various degrees of randomness. The ability of the verification system 10 to introduce random unspecified values is fundamental, since design flaws in practice are usually unpredictable. However, the verification system 10 typically contains provisions for biasing the tests toward conditions of interest, for example boundary conditions.

An abstract behavioral model 14 holds a formal description of the specification of the system. This specification may be stored in a database, which may also incorporate testing knowledge of the system design.

The behavioral model 14 is adapted to the problem of testing system interconnects. It contains component types 15 of the system being verified, configurations 17 of connections between them and transactions 19 that may occur during operation of the system being verified.

A generic test generator engine 22 has a user input 20, which influences the test generator engine 22. The influence of the input 20 includes, for example, the identity of the transactions to be generated, their relative order, and various parameters relating to the transactions. The user input 20 can be entered using a test template, if desired.

The test generator engine 22 may also receive some generic knowledge of the system specification, and can exploit this knowledge to generate sequences of transactions to form the test cases 30. The test cases 30 are executed by an execution engine 12 on an implementation of the system under test.

Execution of the test cases 30 produces a response 34 from the system. The response 34 is submitted to a validation engine 36, which has knowledge of the expected response, validates the response 34, and produces validation results 38. These results can either be 'pass', if the system behaved as expected, or 'failed' otherwise.

The principles of the invention have been applied using the IBM testing system X-GEN, details of which are described in the document R. Emek, I. Jaeger, Y. Naveh, G. Bergman, G. Aloni, Y. Katz, M. Farkash, I. Dozoretz, and A. Goldin. X-Gen: *A Random Test Case Generator for Systems and SoC's*. In IEEE International High Level Design Validation and Test Workshop, pages 145-150, Cannes, France, October 2002. However, as noted above, the principles of the invention can readily be applied to other verification systems by those skilled in the art.

System Under Test

A hardware system suitable for verification according to the instant invention can be viewed as comprised of two complementary layers, each containing a set of resources or components: (1) computational components, e.g., processors, digital signal processors (DSP's), coprocessors, and (2) memory related devices, e.g., random access memories, caches, I/O devices, and DMA engines. Many systems and SoC's contain multiple instances of the same type of component or resource, e.g., multiple processors, multiple memories, and I/O devices. An interconnect layer is used to transfer information from one layer to another, and among components in the same layer. For example, a transaction might involve transfer of data from one memory to another. In general, transactions with multiple participants or actors are handled. The principles of the invention are applicable to systems that contain multiple instances of any participant type.

A system bus is a simple and commonly used type of interconnect. Modern system architectures typically use more complex, network-based interconnect mechanisms. These may contain bus-bridges, hubs, switches, etc.

The verification of systems is done using test cases that are comprised of a set of transactions. Several resources, as well as the part of the interconnect used for the communication between these resources, are stimulated by a transaction. Transaction examples are a processor accessing a certain memory location, or a processor initiating an interprocessor-interrupt to another processor by notifying the system's interrupt controller.

A transaction is usually initiated by instructing one of the resources of the system to access another resource. In a system having a processor and memory example, this would be done by executing a store or a load assembly instruction on the processor. In prior practice, system level test case generation would be centered at the resources of the system, and not on the interconnect. Typically, the resources participating in this transaction would be selected. According to common practice, this selection process would be done in one of two ways, either manually by a verification engineer, or by choice from a set of available resources. The first alternative is labor-intensive. The second alternative tends to produce a nonoptimum distribution of selected resources, even a uniform distribution, resulting in a proliferation of uninteresting and time-consuming test cases.

The invention is based on a random, non-uniform choice of combinations of resources to be used for system level transactions. Testing knowledge is employed to bias the selection of resources toward interesting cases. System-level design flaws are often related to scenarios in which several consumers contend for the usage of a single resource.

Figure 2:
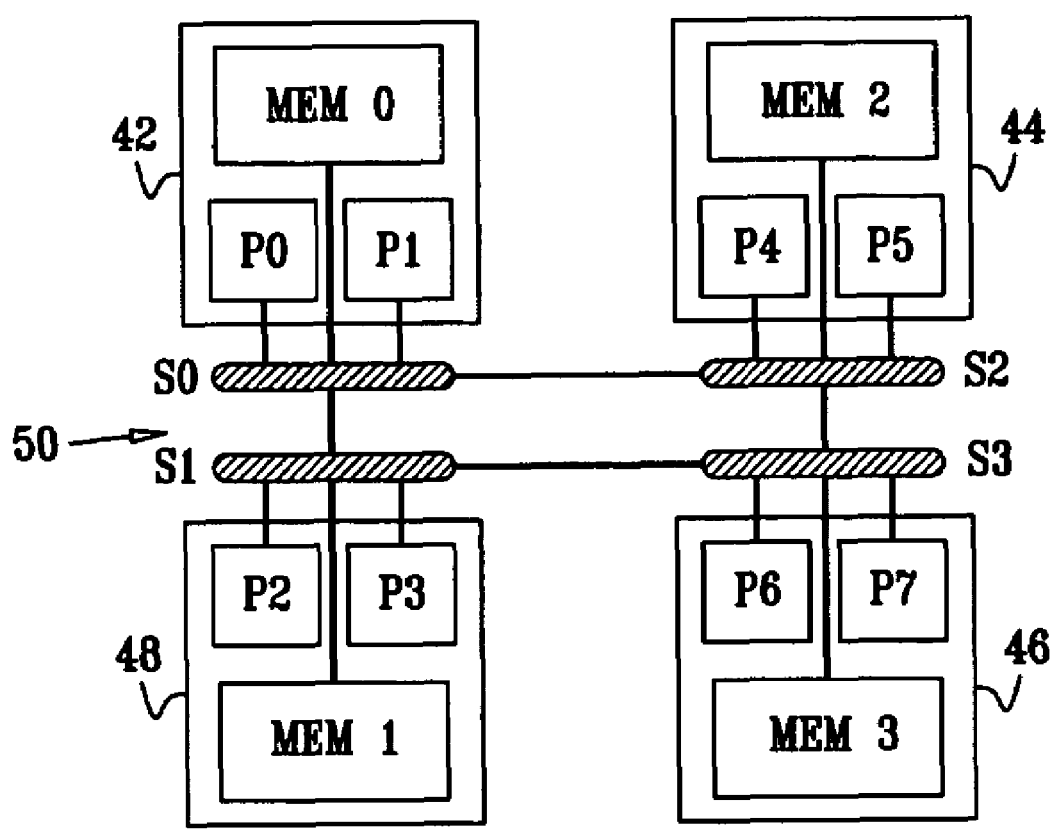
FIG. 2 is a schematic of an exemplary system for verification of a system in accordance with a disclosed embodiment of the invention.

Reference is now made to FIG. 2, which is a schematic of a system 40 for which testing knowledge can be developed in accordance with a disclosed embodiment of the invention. This system is comprised of four nodes 42, 44, 46, 48, connected together by an interconnect subsystem 50. Each node contains two processors and a memory. According to the specification of the system 40, each processing element may access the memory of its own node, as well as the memory of any of the other nodes. The system 40 contains eight processing elements P0-P7, four memories, Mem0-Mem3, and four switches S0-S3.

The Probability Matrix

If a test case generator were to generate a transaction of type T, and the type T requires an instance of a resource A and an instance of a resource B, it would randomly choose a pair (a,b) from a Cartesian product, instances (A) x instances (B). If the resource A has four instances, and the resource B has eight instances, a random uniform choice would result in a probability of $$\frac{1}{(8\times 4)} = \frac{1}{32} = 3.125\%$$

for each combination of instances.

One technique of configuration based testing knowledge is referred to as "actor choice pattern" (ACP). Continuing to refer to the example of FIG. 2, and disregarding other types of testing knowledge, it will be apparent from the above discussion that probability of generating a transaction between any pair of a processing element and a memory is $$\frac{1}{4\times 8} = \frac{1}{32}.$$

The actor choice pattern approach aims at generating interesting patters for transactions that involve several components (actors). A nonuniform distribution function is developed, and used when choosing actors for newly generated transactions. The distribution function is represented as a probability matrix, in which each cell represents the probabilities of a transaction of a particular actor combination, e.g., a memory-processor combination.

For example, the uniform distribution matrix for a processor—memory transaction for the system 40 is shown in Table 1. An example of a nonuniform matrix is shown in Table 2. It will be seen, for example, that the probability of a transaction involving the processor P1 and the memory Mem1 is ⅛. The probability of a transaction involving the processor P0 and the memory Mem1 is zero. The probabilities have thus been biased.

Sparse matrices like the one shown in Table 2 cause the traffic in a particular test case to concentrate in some parts of the interconnect subsystem 50. The basic testing knowledge technique underlying ACP is that for each test case, a sparse probability matrix is created. This probability matrix can be completely random, or, it can take into account issues such as the topology of the system being verified, or its configuration. Using a sufficiently large number of test cases, different patterns of stress are imposed on different parts of the interconnect subsystem 50. Essentially, a specific probability matrix is customized for each transaction type, for selection of the combination of resources to be used in the transaction. During the generation of a single test case, the same probability matrix is used for all like transactions. As a result, some combinations of resources are used more often then others, thereby stressing the interconnect between the resources participating in the favored combinations.

In general, a n-dimensional distribution function is represented by a n-dimensional matrix for use with a transaction using n resource types or categories, each dimension representing a resource involved in the transaction, and each cell representing the probability of a transaction between any n resources of the same or different categories. The dimensionality of the matrix is determined by the number of elements resources of whatever category participating in a transaction. The size of each dimension of the matrix is determined by the number of resources in the respective categories that exist in the system. The size and dimensionality are limited only by the capabilities of the hardware. Values of n up to 16 or 32 are suitable.

For example, in a system in which there are 10 categories A-J, consider a transaction involving a resource element from each of categories A (5 available resources), B (3 available resources), and C (2 available resource), totaling three resources. A 3-dimensional matrix is required, in which the A, B, and C dimensions have 5, 3, and 2 cells respectively. As another example, assume that a transaction involves four resources, all from the same category A. A 4-dimensional matrix would be used to represent the appropriate distribution function. Each dimension would have 5 cells.

As noted above, some of the probabilities can be zero. An advantage of the use of probability matrices is that a matrix may be reused for different types of transactions. Alternatively, in some applications it may be desirable to employ a different matrix for each transaction type. The matrix (or matrices) can be provided by the user, or can be randomly generated during by the test generator, typically during its initialization phase.

The characteristics of a randomly generated probability matrix can be controlled by a set of user-defined parameters, such as the number and distribution of cells having high probability. Thus, it is quite possible that some cells of the probability matrix would have zero probability. When randomly generating a probability matrix, the generator may take into account additional information about the structure of the system. For example, processors from the same chip, node or another logically meaningful area of the system may have high probability of using the same set of memory or I/O resources.

It will be appreciated by persons skilled in the art that the present invention is not limited to what has been particularly shown and described hereinabove. Rather, the scope of the present invention includes both combinations and subcombinations of the various features described hereinabove, as well as variations and modifications thereof that are not in the prior art, which would occur to persons skilled in the art upon reading the foregoing description.

TABLE 1

|      | P0   | P1   | P2   | P3   | P4   | P5   | P6   | P7   |
|------|------|------|------|------|------|------|------|------|
| Mem0 | 1/32 | 1/32 | 1/32 | 1/32 | 1/32 | 1/32 | 1/32 | 1/32 |
| Mem1 | 1/32 | 1/32 | 1/32 | 1/32 | 1/32 | 1/32 | 1/32 | 1/32 |
| Mem2 | 1/32 | 1/32 | 1/32 | 1/32 | 1/32 | 1/32 | 1/32 | 1/32 |
| Mem3 | 1/32 | 1/32 | 1/32 | 1/32 | 1/32 | 1/32 | 1/32 | 1/32 |

TABLE 2

|      | P0  | P1  | P2 | P3  | P4 | P5  | P6  | P7  |
|------|-----|-----|----|-----|----|-----|-----|-----|
| Mem0 |     |     |    |     |    |     |     |     |
| Mem1 |     | 1/8 |    |     |    |     |     |     |
| Mem2 | 1/8 |     |    | 1/4 |    | 1/8 |     |     |
| Mem3 |     |     |    |     |    |     | 1/4 | 1/8 |

The invention claimed is:

1. A method of verifying a system design of a type having a plurality of first resources, a plurality of second resources, and an interconnect therebetween, comprising the steps of:
    defining a transaction, wherein a selected one of said first resources communicates with a selected one of said second resources via said interconnect;
    defining a distribution function of probabilities of establishing said transaction between each of said first resources and each of said second resources;
    generating a test program that includes an instance of said transaction, wherein said one first resource and said one second resource are selected responsively to said distribution function;
    executing said test program on said system design; and
    evaluating said interconnect responsively to said step of executing said test program.

2. The method according to claim 1, wherein said distribution function is represented as a probability matrix, each cell of said matrix representing a probability of a combination of one of said first resources and one of said second resources in said transaction.

3. The method according to claim 2, wherein said matrix is defined randomly.

4. The method according to claim 2, wherein said matrix is defined under control of specified parameters.

5. The method according to claim 1, wherein said first resources and said second resources are selected from the group consisting of processors, digital signal processors, random access memories, caches, I/O devices, and DMA engines.

6. A computer software product, stored on a computer-storage medium in which computer program instructions are stored, which instructions, when executed by a computer, cause the computer to perform a method of verifying a system design of a type having a plurality of first resources, a plurality of second resources, and an interconnect therebetween, comprising the steps of:
    defining a transaction, wherein a selected one of said first resources communicates with a selected one of said second resources via said interconnect;
    defining a distribution function of probabilities of establishing said transaction between each of said first resources and each of said second resources;
    generating a test program that includes an instance of said transaction, wherein said one first resource and said one second resource are selected responsively to said distribution function;
    executing said test program on said system design; and
    evaluating said interconnect responsively to said step of executing said test program.

7. The computer software product according to claim 6, wherein said distribution function is represented as a probability matrix, each cell of said matrix representing a probability of a combination of one of said first resources and one of said second resources in said transaction.

8. The computer software product according to claim 7, wherein said matrix is defined randomly.

9. The computer software product according to claim 7, wherein said matrix is defined under control of specified parameters.

10. A verification system for testing a system design of a type having a plurality of first resources, a plurality of second resources, and an interconnect therebetween, comprising a processor operative to perform the steps of:
    defining a transaction, wherein a selected one of said first resources communicates with a selected one of said second resources via said interconnect;
    defining a distribution function of probabilities of establishing said transaction between each of said first resources and each of said second resources;
    generating a test program that includes an instance of said transaction, wherein said one first resource and said one second resource are selected responsively to said distribution function;
    executing said test program on said system design; and
    evaluating said interconnect responsively to said step of executing said test program.

11. The verification system according to claim 10, wherein said distribution function is represented as a probability matrix, each cell of said matrix representing a probability of a combination of one of said first resources and one of said second resources in said transaction.

12. The verification system according to claim 11, wherein said matrix is defined randomly.

13. The verification system according to claim 11, wherein said matrix is defined under control of specified parameters.

14. A method of verifying a system design of a type having a plurality of resources comprising a plurality of resource categories, and an interconnect therebetween, comprising the steps of:
    defining a transaction, wherein participants therein comprise a number n of said resources, said participants intercommunicating via said interconnect;
    defining a n-dimensional distribution function of probabilities of establishing said transaction among any combination of said resources in respective ones of said resource categories thereof, wherein a size of each dimension of said distribution function corresponds to a count of said resources in its respective said resource categories;
    generating a test program that includes an instance of said transaction, wherein said participants are chosen responsively to said distribution function;
    executing said test program on said system design; and
    evaluating said interconnect responsively to said step of executing said test program.

15. The method according to claim 14, wherein n is at least 3.

16. The method according to claim 14, wherein n does not exceed 32.

17. The method according to claim 14, wherein said distribution function is represented as a n-dimensional probability matrix, each cell of said matrix representing a probability of a said combination of one of said resources and another of said resources in said transaction.

18. The method according to claim 17, wherein said matrix is defined randomly.

19. The method according to claim 17, wherein said matrix is defined under control of specified parameters.

20. A computer software product, stored on a computer-storage medium in which computer program instructions are stored, which instructions, when executed by a computer, cause the computer to perform a method of verifying a system design of a type having a plurality of resources comprising a plurality of resource categories, and an interconnect therebetween, comprising the steps of:
- defining a transaction, wherein participants therein comprise a number n of said resources, said participants intercommunicating via said interconnect;
- defining a n-dimensional distribution function of probabilities of establishing said transaction among any combination of said resources in respective ones of said resource categories thereof, wherein a size of each dimension of said distribution function corresponds to a count of said resources in its respective said resource categories;
- generating a test program that includes an instance of said transaction, wherein said participants are chosen responsively to said distribution function;
- executing said test program on said system design; and
- evaluating said interconnect responsively to said step of executing said test program.

21. The computer software product according to claim 20, wherein n is at least 3.

22. The computer software product according to claim 20, wherein n does not exceed 32.

23. The computer software product according to claim 20, wherein said distribution function is represented as a n-dimensional probability matrix, each cell of said matrix representing a probability of a said combination of one of said resources and another of said resources in said transaction.

24. The computer software product according to claim 23, wherein said matrix is defined randomly.

25. The computer software product according to claim 23, wherein said matrix is defined under control of specified parameters.

26. A verification system of verifying a system design of a type having a plurality of resources comprising a plurality of resource categories, and an interconnect therebetween, comprising a processor operative to perform the steps of:
- defining a transaction, wherein participants therein comprise a number n of said resources, said participants intercommunicating via said interconnect;
- defining a n-dimensional distribution function of probabilities of establishing said transaction among any combination of said resources in respective ones of said resource categories thereof, wherein a size of each dimension of said distribution function corresponds to a count of said resources in its respective said resource categories;
- generating a test program that includes an instance of said transaction, wherein said participants are chosen responsively to said distribution function;
- executing said test program on said system design; and
- evaluating said interconnect responsively to said step of executing said test program.

27. The verification system according to claim 26, wherein n is at least 3.

28. The verification system according to claim 26, wherein n does not exceed 32.

29. The verification system according to claim 26, wherein said distribution function is represented as a n-dimensional probability matrix, each cell of said matrix representing a probability of a said combination of one of said resources and another of said resources in said transaction.

30. The verification system according to claim 29, wherein said matrix is defined randomly.

31. The verification system according to claim 29, wherein said matrix is defined under control of specified parameters.

32. The verification system according to claim 26, wherein said resources are selected from the group consisting of processors, digital signal processors, random access memories, caches, I/O devices, and DMA engines.

* * * * *